United States Patent
Eitel (10) Patent No.: US 8,402,074 B2
(45) Date of Patent: Mar. 19, 2013

(54) ADAPTIVE FILTER DEVICE AND METHOD FOR DETERMINING FILTER COEFFICIENTS

(75) Inventor: Ben Eitel, Gaertringen (DE)

(73) Assignee: Sony Deutschland GmbH, Berlin (DE)

( * ) Notice: Subject to any disclaimer, the term of this patent is extended or adjusted under 35 U.S.C. 154(b) by 1142 days.

(21) Appl. No.: 12/078,386

(22) Filed: Mar. 31, 2008

(65) Prior Publication Data

US 2008/0250090 A1 Oct. 9, 2008

(30) Foreign Application Priority Data

Mar. 31, 2007 (EP) .................... 07006802

(51) Int. Cl.
*G06F 17/10* (2006.01)
(52) U.S. Cl. ...................... 708/322
(58) Field of Classification Search .............. None
See application file for complete search history.

(56) References Cited

U.S. PATENT DOCUMENTS

| | | | | | |
|---|---|---|---|---|---|
| 5,058,047 | A | * | 10/1991 | Chung | 708/322 |
| 5,627,799 | A | * | 5/1997 | Hoshuyama | 367/121 |
| 6,055,318 | A | * | 4/2000 | Whitecar | 381/94.2 |
| 6,219,427 | B1 | | 4/2001 | Kates et al. | |
| 6,970,896 | B2 | * | 11/2005 | Awad et al. | 708/322 |
| 2003/0084079 | A1 | * | 5/2003 | Awad et al. | 708/322 |
| 2008/0082597 | A1 | * | 4/2008 | Batruni | 708/322 |
| 2008/0250090 | A1 | * | 10/2008 | Eitel | 708/201 |

FOREIGN PATENT DOCUMENTS

| | | |
|---|---|---|
| EP | 0 400 850 A2 | 12/1990 |
| EP | 0 700 156 A2 | 3/1996 |
| EP | 0 955 727 A2 | 11/1999 |

OTHER PUBLICATIONS

K. C. Ho, et al., "Bias Removal in Equation-Error Adaptive IIR Filters", IEEE Transactions on Signal Processing, vol. 43, No. 1, Jan. 1995, XP-000505176, pp. 51-62.
John J. Shynk, "Adaptive IIR Filtering", IEEE ASSP Magazine, vol. 6, No. 2, XP-002468819, Apr. 1989, pp. 4-21.
Simon Haykin, "Adaptive Filter theory", Fourth edition, Prentice Hall, 2002, pp. 22-25.
Roberto López-Valcarce, et al., "Stable Estimates in Equation Error Identification", Proc of the $36^{th}$ IEEE CDC San Diego, CA, vol. 2, Dec. 10-12, 1997, pp. 1678-1679.
Phillip A. Regalia, et al., "An Unbiased Equation Error Identifier and Reduced-Order Approximations", IEEE Transactions on Signal Processing, vol. 42, No. 6, Jun. 1994, pp. 1397-1412.
Chinese Office Action issued Jun. 8, 2011, in Patent Application No. 2008100884721 (English Translation Only).
Chinese Office Action for CH Application No. 2008-100884721, dated Nov. 2, 2011, (English translation only).

* cited by examiner

*Primary Examiner* — David H Malzahn
(74) *Attorney, Agent, or Firm* — Oblon, Spivak, McClelland, Maier & Neustadt, L.L.P.

(57) ABSTRACT

An adaptive filter device, including a finite impulse response (FIR) filter which is based on filter coefficients, which are determined based on a predetermined iterative adaptation algorithm for determining filter coefficients of an adaptive filter, wherein, in at least one iteration step of said predetermined iterative adaptation algorithm a sum value is determined, wherein each summand of said sum value depends on one of said filter coefficients, and, if said sum value is above a predetermined threshold, the filter coefficients are modified.

24 Claims, 8 Drawing Sheets

ADAPTIVE FILTER DEVICE AND METHOD FOR DETERMINING FILTER COEFFICIENTS

An embodiment of the invention relates to an adaptive filter device. A further embodiment of the invention relates to a method for determining filter coefficients of an adaptive filter.

BACKGROUND OF THE INVENTION

Adaptive filters are often used in practical implementations due to their excellent performance, especially in an environment of unknown statistics or in inherently non-stationary environment. The underlying algorithms may either be based on an equation-error (EE) formulation or an output error (OE) formulation. Since the equation-error formulation is a convex problem with one global minimum and due to its straight forward design it is often used in practical implementations. The main disadvantage of the EE formulation is the fact that a general stability of the filter is only guaranteed in case of special filter constraints, which often results in a conflict with practical implementations.

BRIEF SUMMARY OF THE INVENTION

It is an object of the invention to provide an adaptive filter with high stability.

This object is solved in accordance with claims 1, 12 and 21, respectively.

Further details of the invention will become apparent from a consideration of the drawings and ensuing description.

DETAILED DESCRIPTION OF THE INVENTION

In the following, embodiments of the invention are described. It is important to note, that all described embodiments in the following may be combined in any way, i.e. there is no limitation that certain described embodiments may not be combined with others.

Figure 1:
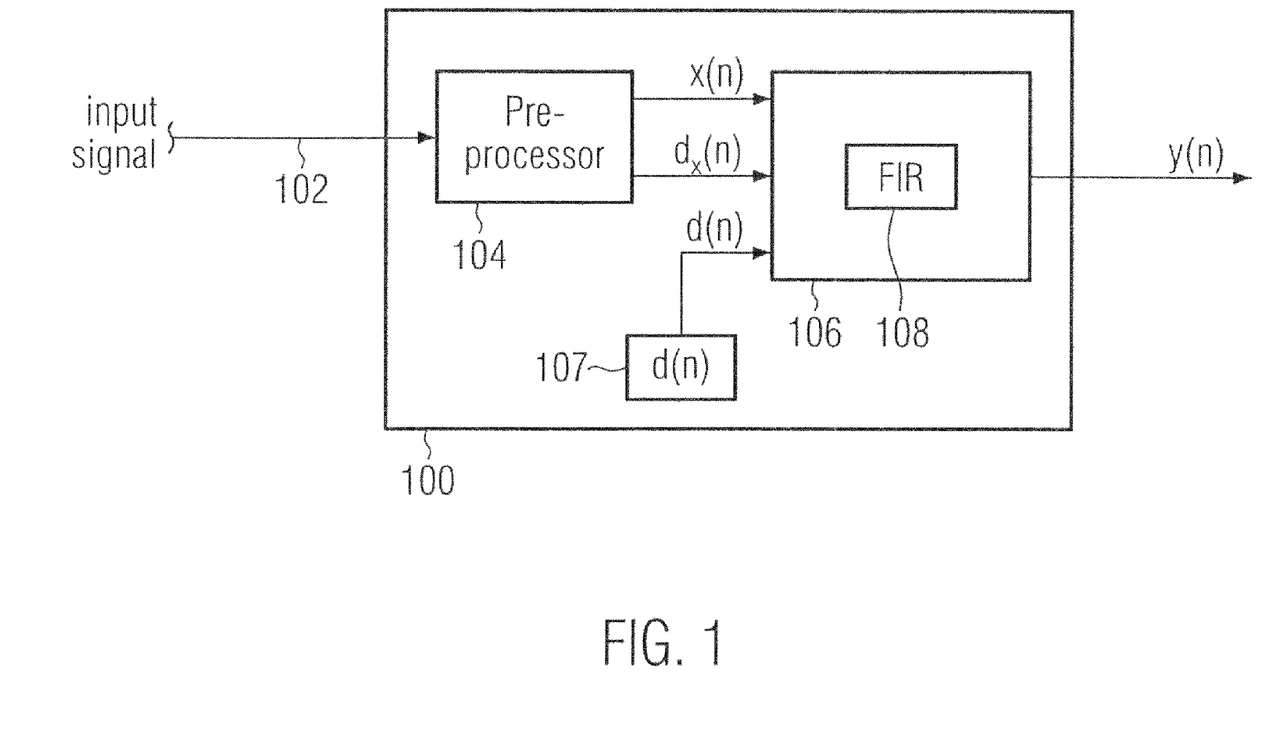
FIG. 1 shows an adaptive filter device according to an embodiment of the invention.

FIG. 1 shows an adaptive filter device 100 having as input an input signal 102, e.g. an analogue television signal and as output an output signal y(n). Input signal 102 may also be an orthogonal frequency division multiplex (OFDM) signal.

Adaptive filter device 100 comprises a preprocessor 104, an adaptive filter 106 and a signal storage 107 that stores a predetermined reference signal d(n). Pre-processor 104 generates from said television signal 102 a first input signal x(n) and a second input signal $d_x(n)$ for said adaptive filter 106. The second input signal $d_x(n)$ is a received reference signal, e.g. a non-visible signal, that is transmitted together with analogue television signal 102. The purpose of the received reference signal may e.g. be to remove multi-path echoes from a received analogue television signal. A further input to said adaptive filter 106 is the predetermined reference signal d(n). The predetermined reference signal d(n) may e.g. correspond to a difference signal of two predetermined ghost cancelling reference signals GCR_A and GCR_B transmitted in different lines of the television signal x(n).

The filter characteristic of adaptive filter 106 depends on filter coefficients of an FIR filter 108 located in said adaptive filter 108.

In order to obtain a stable behaviour of adaptive filter device 100, the filter coefficients of finite impulse response filter (FIR) 108 are determined based on a predetermined iterative adaptation algorithm for determining filter coefficients of an adaptive filter, wherein, in at least one iteration step of said predetermined iterative adaptation algorithm a sum value is determined, wherein each summand of said sum value depends on one of said filter coefficients, and, if said sum value is above a predetermined threshold, the filter coefficients are modified. The filter coefficients are determined based on the received reference signal $d_x(n)$ and predetermined reference signal d(n), e.g. during receiving said received reference signal $d_x(n)$. The determined filter coefficients are then used to filter signal x(n).

Figure 3:
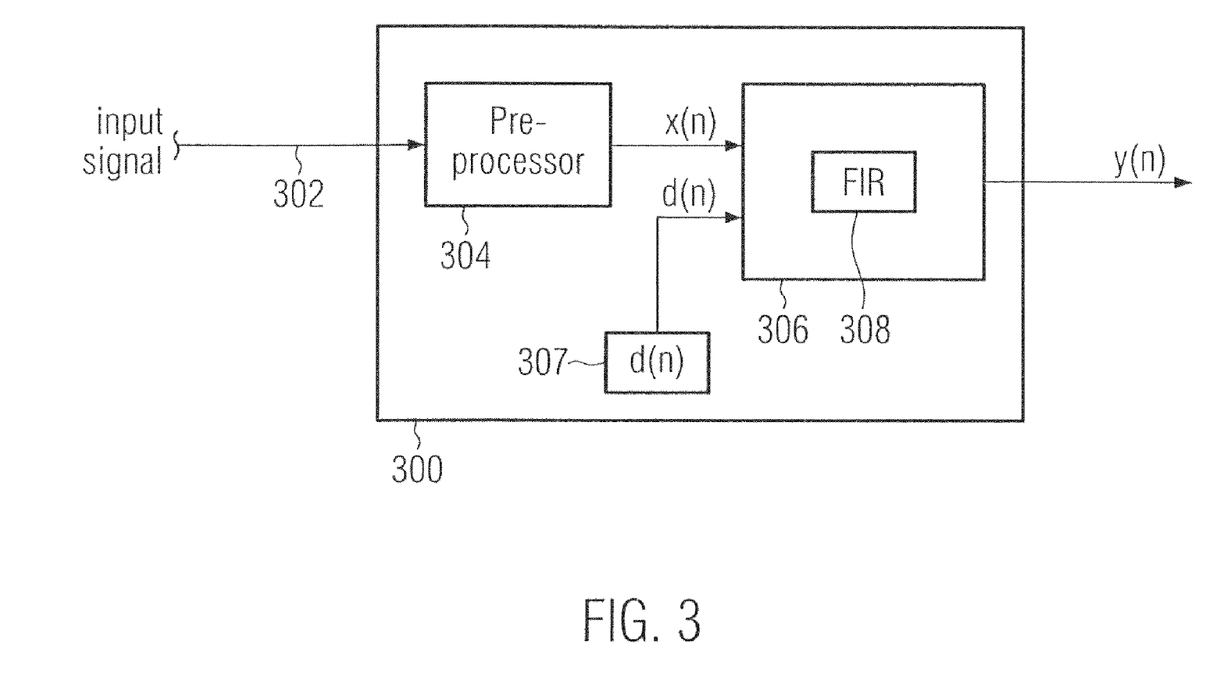
FIG. 3 shows an adaptive filter device according to a further embodiment of the invention.

As predetermined iterative adaptation algorithm, the algorithm described in "Adaptive IIR Filtering" by John J. Shynk, published in IEEE ASSP Magazine, April 1989 may be used. In particular, the predetermined iterative adaptation algorithm may be applied in accordance with an equation error formulation of the adaptive filter device as shown in FIG. 3 of the cited reference "Adaptive IIR filtering" by John J. Shynk and corresponding description thereof.

In a further embodiment, the filter coefficients may be modified such that after modification the sum value is below or equal to the predetermined threshold. The sum value may e.g. be descriptive of an energy of the filter or to a sum of squares of absolute values of the filter coefficients, and the predetermined threshold may correspond to a threshold limiting the energy of the FIR filter. The sum value may also correspond to the root of a sum of absolute values to the x-th power as defined below in Eq. (1).

Further, the filter coefficients may be modified by multiplying the filter coefficients with a constant value. The constant value may be chosen to be smaller or equal to one. If the constant value is chosen equal to zero, the sum value may be equal to the predetermined threshold.

The filter coefficients may also be modified by dividing the filter coefficients by the sum value.

Further, the modified filter coefficients may be used for a next iteration step of the predetermined iterative adaptation algorithm.

Figure 2:
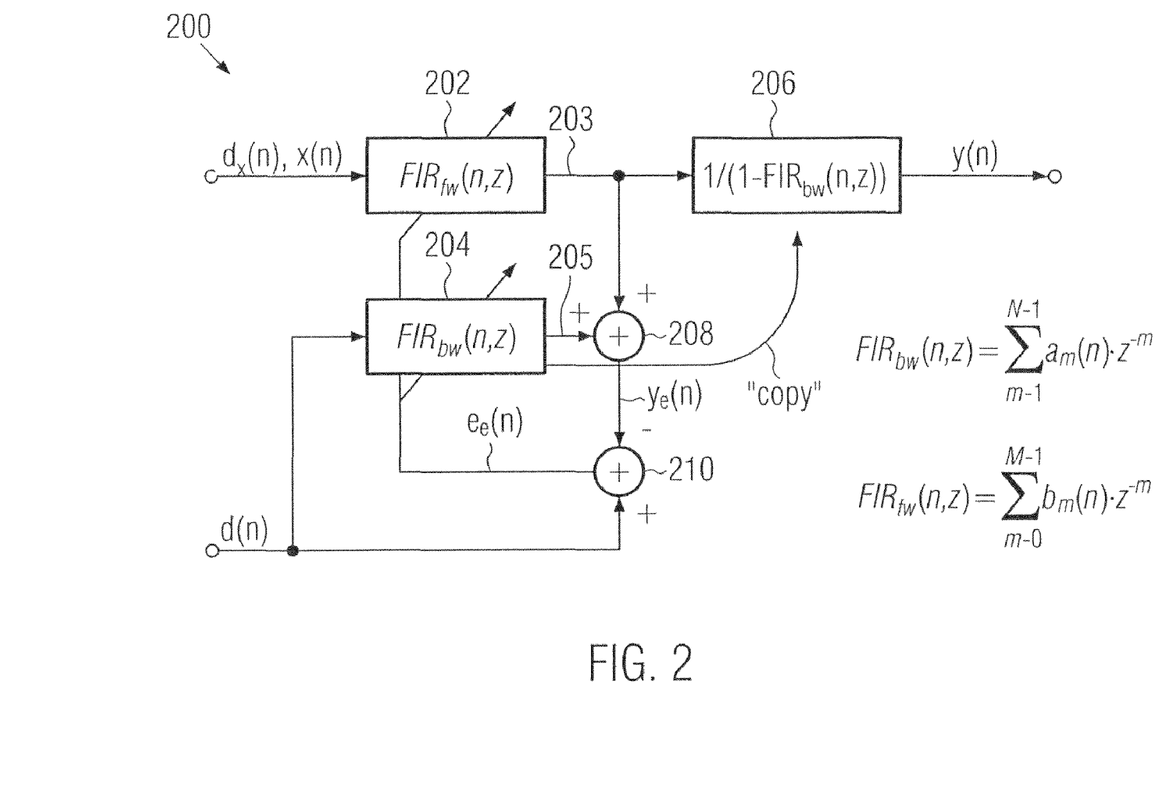
FIG. 2 shows an adaptive filter according to a further embodiment of the invention.

The adaptive filter device may also comprise an infinite impulse response (IIR) filter in cascade with the finite impulse response filter (see also FIG. 2).

In a further embodiment, the adaptive filter device may be based on equation error formulation as described in the aforementioned reference "Adaptive IIR filtering" by John J. Shynk.

The filter coefficients may also be determined in order to equalize notches, e.g. present in an analogue television signal.

In a further embodiment, it may also be possible that the FIR filter has a tap size M and the IIR filter has a tap size N, wherein M and N are positive integer values and may be set independently from each other.

The sum value may be calculated according to the following formula:

$$\sqrt[x]{\sum_{m=0}^{M-1} |b_m|^x},$$

wherein $b_m$ denotes a respective filter coefficient and x is a real value greater zero (x>0).

In a further embodiment, the filter coefficients $b_K$ may be modified based on the following formula:

$$b_{k\_new} = b_k \cdot K_0 \cdot \Gamma_0 \bigg/ \sqrt[x]{\sum_{m=0}^{M-1} |b_m|^x}, \quad k = 0, 1, \ldots, M-1 \quad (1)$$

wherein
$b_{k\_new}$: new filter coefficients of adaptive filter for next iteration step;
$b_k$: filter coefficients determined according to predetermined iterative adaptation algorithm;
$K_0$: normalization factor;
$\Gamma_0$: said predetermined threshold,
M: tap size of FIR filter,
x: real value greater zero.

In an embodiment, $\Gamma_0$ may be set to equal to 3.0. With such setting good results may be obtained. Of course, in general $\Gamma_0$ may be set depending on the application and be determined heuristically.

In a further embodiment, the adaptive filter device may be an equalizer for removing at least one multi-path echo of a received analog television signal.

In a further embodiment, a receiver for receiving an analogue television signal may comprise an adaptive filter device as defined above.

In other words, according to an embodiment of the invention, filter coefficients may be determined based on first filter coefficients that depend on a sum value, wherein each summand of said sum value depends on one of said filter coefficients, and, wherein, if the sum value is below a predefined threshold, the filter coefficients are to be chosen to be equal to the first filter coefficients, and, if the sum value is equal to or above the predetermined threshold, then the filter coefficients are determined such that the sum value becomes smaller than or equal to the predefined threshold.

A further embodiment of the invention concerns a method for determining filter coefficients e.g. of a finite impulse response (FIR) filter of an adaptive filter device, comprising determining the filter coefficients based on a predetermine iterative adaptation algorithm for determining filter coefficients of an adaptive filter, determining, in at least one iteration step of the predetermined iterative adaptation algorithm, a sum value, wherein each summand of the sum value depends on one of the filter coefficients, and modifying, if the sum value is above a predetermined threshold, the filter coefficients.

The modification with the method may be done as explained above.

A further embodiment of the invention concerns a computer program product, e.g. a computer readable storage medium or downloadable executable or preinstalled program on a computer, including computer program instructions that cause a computer to execute a method as defined above.

FIG. 2 corresponds to a further embodiment of the invention and shows an equation error adaptive IIR filter 200 comprising a first finite impulse response (FIR) filter 202, a second FIR filter 204, and an all-pole filter 206 (IIR filter).

An input to the first FIR filter 202 is a television signal x(n) or, if a reference signal is received, the received reference signal $d_x(n)$. An input to the second FIR filter 204 is the predetermined reference signal d(n). A first output signal 203 is used as input for the all-pole filter 206. All-pole filter 206 has as output a filtered television signal y(n). Filtered television signal y(n) may e.g. comprise less disturbances than television signal x(n) resulting from e.g. multi-path echoes.

The first output signal 203 is used together with a second output signal 205 of said second FIR filter 204 in order to generate a first error signal $y_e(n)$, if the received reference signal $d_x(n)$ is received. First error signal $y_e(n)$ is determined by adding said first and second output signals 203, 205. In order to determine the filter coefficients of the first and second FIR filters 202, 204, an equation error signal $e_e(n)$ is determined by subtracting the first error signal $y_e(n)$ from reference signal d(n).

The first FIR filter 202 is given by the following formula:

$$FIR_{fw}(n, z) = \sum_{m=0}^{M-1} b_m(n) \cdot z^{-m}$$

The second FIR filter 204 is given by the following formula:

$$FIR_{bw}(n, z) = \sum_{m=1}^{N-1} a_m(n) \cdot z^{-m}$$

After each update of the weights, the inverse of 1-$FIR_{bw}$ (n,z) is copied to the all-pole filter 206 which is in cascade with the first FIR filter 202.

The copying operation is denoted by an arrow in FIG. 2 marked with "copy".

If the input signal corresponds to x(n), e.g. before or after receiving a received reference signal $d_x(n)$, the filter coefficients of first FIR filter 202 and all-pole filter 206 are used to filter input signal x(n) in order to obtain filtered television signal y(n).

In order to provide a stable filter, according to an embodiment of the invention, a sum value of the filter coefficients of the first FIR filter 202 may be limited. The sum value may describe or be correlated with the energy of FIR filter 202.

If the sum value of first FIR filter 202 is limited, the adaptation filter may be kept stable whereas a large sum value could lead to instable IIR filter coefficients, i.e. to an instable behavior of all-pole filter 206.

Therefore, the maximum sum value (maximum FIR filter energy) of first FIR filter 202 is limited if the sum value exceeds a certain threshold $\Gamma_0$ during the adaptation process. Therefore, the FIR filter coefficients of first FIR filter 202 may be multiplied with an additional normalization factor $K_0$ slightly smaller than or equal to 1.0 to allow for an ongoing adaptation process of the FIR filter. $K_0$ may also be larger than 1.

Thus, during the adaptation process of the first FIR filter 202, it is checked if the threshold is exceeded according to the following formula:

$$\Gamma_0 < f(b_m), m=0, \ldots, M-1,$$

wherein $f(b_m)$ corresponds to a suitable function for keeping the filter stable e.g. by limiting the absolute values of the filter coefficients or an energy measure. $f(b_m)$ may e.g. be chosen to be:

$$\Gamma_0 < \sqrt[x]{\sum_{m=0}^{M-1} |b_m|^x}$$

wherein $b_m$ denotes a respective filter coefficient and x is a real value greater than zero (x>0). x may e.g. be chosen to be equal to 2.

If the threshold $\Gamma_0$ is not exceeded, the FIR filter coefficients are not modified. However, if the threshold $\Gamma_0$ is exceeded, the FIR filter coefficients are recomputed to $$b_{k\_new} = b_k \cdot K_0 \cdot \Gamma_0 / \sqrt[x]{\sum_{m=0}^{M-1} |b_m|^x}, k = 0, 1, \ldots, M-1 \quad (2)$$

wherein
$b_{k\_new}$: new filter coefficients of adaptive filter for next iteration step;
$b_k$: filter coefficients determined according to predetermined iterative adaptation algorithm;
$K_0$: normalization factor;
$\Gamma_0$: said predetermined threshold;
M: tap size of FIR filter; and
x: real value greater than zero.
x may be set to e.g. 2.

According to a further embodiment of the invention, the adaptive filter may be adapted to equalize notches. Even in such difficult situations where frequently instabilities are caused, by limiting the sum value as described above, the filter can be kept stable.

As is apparent from the above formulas defining first FIR filter 202 and second FIR filter 204, respectively, the filter tap size of the first FIR filter 202 is denoted by M, whereas the filter tap size of the second FIR filter 204 is denoted by N. Because the coefficients of second FIR filter 204 are copied to all-pole filter 206 as described above, the tap size of all-pole filter 206 is also equal to N.

It is possible to choose M and N as different values. Even in this case filter stability may still be high due to the above explained limitation of the sum value.

It should be noted that the filter shown in FIG. 2 may be realized in software or hardware likewise.

FIG. 3 shows an adaptive filter device 300 according to a further embodiment of the invention having as input an input signal 302, e.g. an analogue television signal and as output an output signal y(n). Input signal 302 may also be an orthogonal frequency division multiplex (OFDM) signal.

Adaptive filter device 300 comprises a preprocessor 304, an adaptive filter 306 and a signal storage 307 that stores a predetermined reference signal d(n). Pre-processor 304 generates from said television signal 302 a first input signal x(n) for said adaptive filter 306. A further input to said adaptive filter 306 is the predetermined reference signal d(n). The predetermined reference signal d(n) may e.g. correspond to a difference signal of two predetermined ghost cancelling reference signals GCR_A and GCR_B transmitted in different lines of the television signal x(n).

The filter characteristic of adaptive filter 306 depends on filter coefficients of an FIR filter 308 located in said adaptive filter 308.

In order to obtain a stable behaviour of adaptive filter device 300, the filter coefficients of finite impulse response filter (FIR) 308 are determined based on a predetermined iterative adaptation algorithm for determining filter coefficients of an adaptive filter, wherein, in at least one iteration step of said predetermined iterative adaptation algorithm a sum value is determined, wherein each summand of said sum value depends on one of said filter coefficients, and, if said sum value is above a predetermined threshold, the filter coefficients are modified. The filter coefficients are determined based on the received reference signal $d_x(n)$ and predetermined reference signal d(n), e.g. during receiving said received reference signal $d_x(n)$. The determined filter coefficients are then used to filter signal x(n).

As predetermined iterative adaptation algorithm, the algorithm described in "Adaptive IIR Filtering" by John J. Shynk, published in IEEE ASSP Magazine, April 1989 may be used. In particular, the predetermined iterative adaptation algorithm may be applied in accordance with an equation error formulation of the adaptive filter device as shown in FIG. 3 of the cited reference "Adaptive IIR filtering" by John J. Shynk and corresponding description thereof.

In a further embodiment, the filter coefficients may be modified such that after modification the sum value is below or equal to the predetermined threshold. The sum value may e.g. be descriptive of an energy of the filter or to a sum of squares of absolute values of the filter coefficients, and the predetermined threshold may correspond to a threshold limiting the energy of the FIR filter. The sum value may also correspond to the root of a sum of absolute values to the x-th as defined below in Eq. (1).

Figure 4:
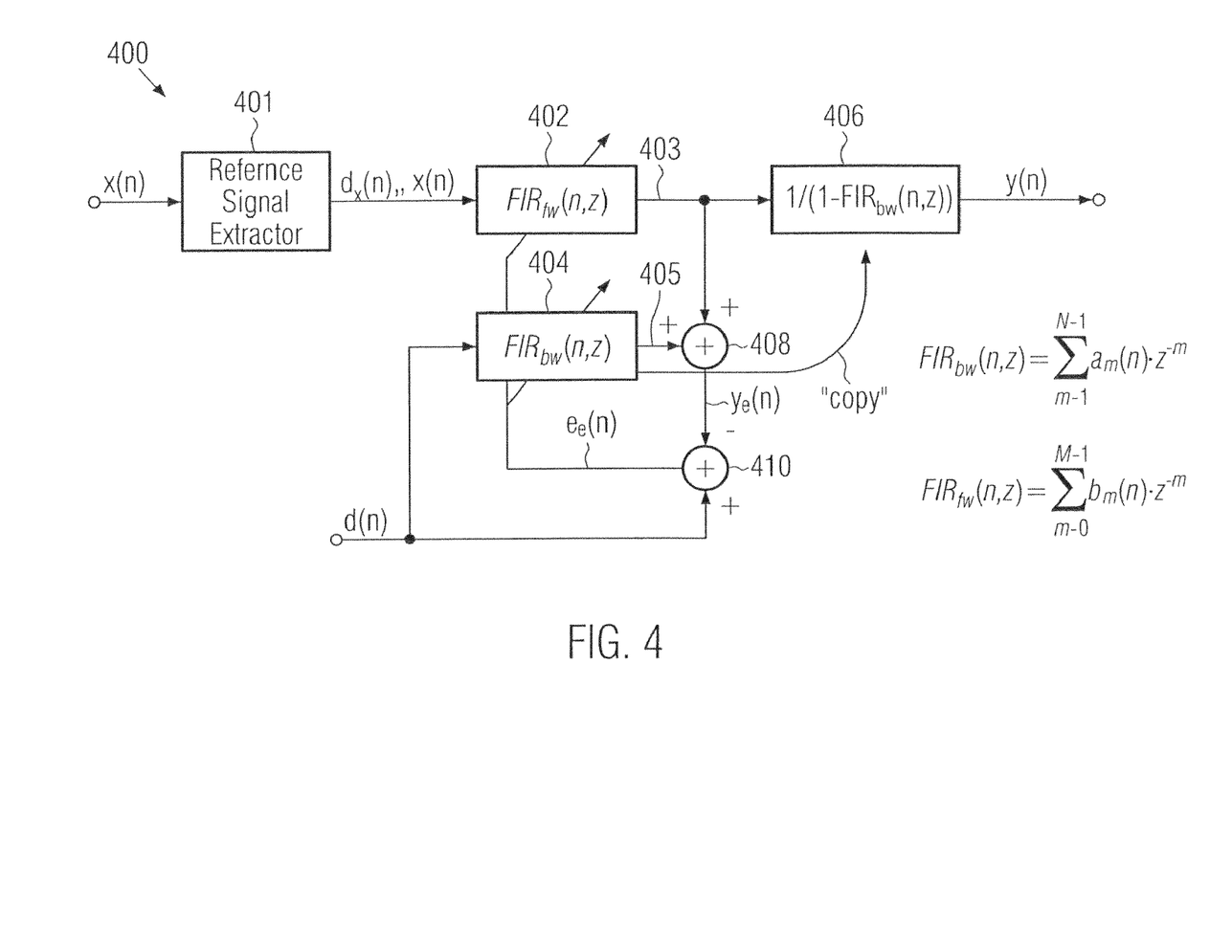
FIG. 4 shows an adaptive filter according to a further embodiment of the invention.

FIG. 4 corresponds to a further embodiment of the invention and shows an equation error adaptive IIR filter 400 comprising a first finite impulse response (FIR) filter 402, a second FIR filter 404, and an all-pole filter 406 (IIR filter).

An input to the first FIR filter 402 is a television signal x(n) or, if a reference signal is received, the received reference signal $d_x(n)$. Received reference signal $d_x(n)$ may be extracted from television signal x(n) by a reference signal extractor 401. Received reference signal $d_x(n)$ is used to determine, e.g. update or modify, the filter coefficients of first and second FIR filters 402, 405, and television signal x(n) is used in order to determine y(n) corresponding to x(n) filtered by filters 402 and 406. Also, when the filter coefficients are calculated, e.g. if a reference signal $d_x(n)$ is received, filter 406 will filter the received reference signal $d_x(n)$ in order to guarantee a continuous output signal y(n).

An input to the second FIR filter 404 is the predetermined reference signal d(n). A first output signal 403 is used as input for the all-pole filter 406. All-pole filter 406 has as output a filtered television signal y(n). Filtered television signal y(n) may e.g. comprise less disturbances than television signal x(n) resulting from e.g. multi-path echoes.

The first output signal 403 is used together with a second output signal 405 of said second FIR filter 404 in order to generate a first error signal $y_e(n)$, if the received reference signal $d_x(n)$ is received. First error signal $y_e(n)$ is determined by adding said first and second output signals 403, 405. In order to determine the filter coefficients of the first and second FIR filters 402, 404, an equation error signal $e_e(n)$ is determined by subtracting the first error signal $y_e(n)$ from reference signal d(n).

The first FIR filter 402 is given by the following formula:

$$FIR_{bw}(n, z) = \sum_{m=1}^{M-1} b_m(n) \cdot z^{-m}$$

The second FIR filter 404 is given by the following formula:

$$FIR_{bw}(n, z) = \sum_{m=1}^{N-1} a_m(n) \cdot z^{-m}$$

After at least one update of the weights, e.g. after several updates, the inverse of 1-$FIR_{bw}(n,z)$ is copied to the all-pole filter 406 which is in cascade with the first FIR filter 402.

The copying operation is denoted by an arrow in FIG. 4 marked with "copy".

Figure 5:
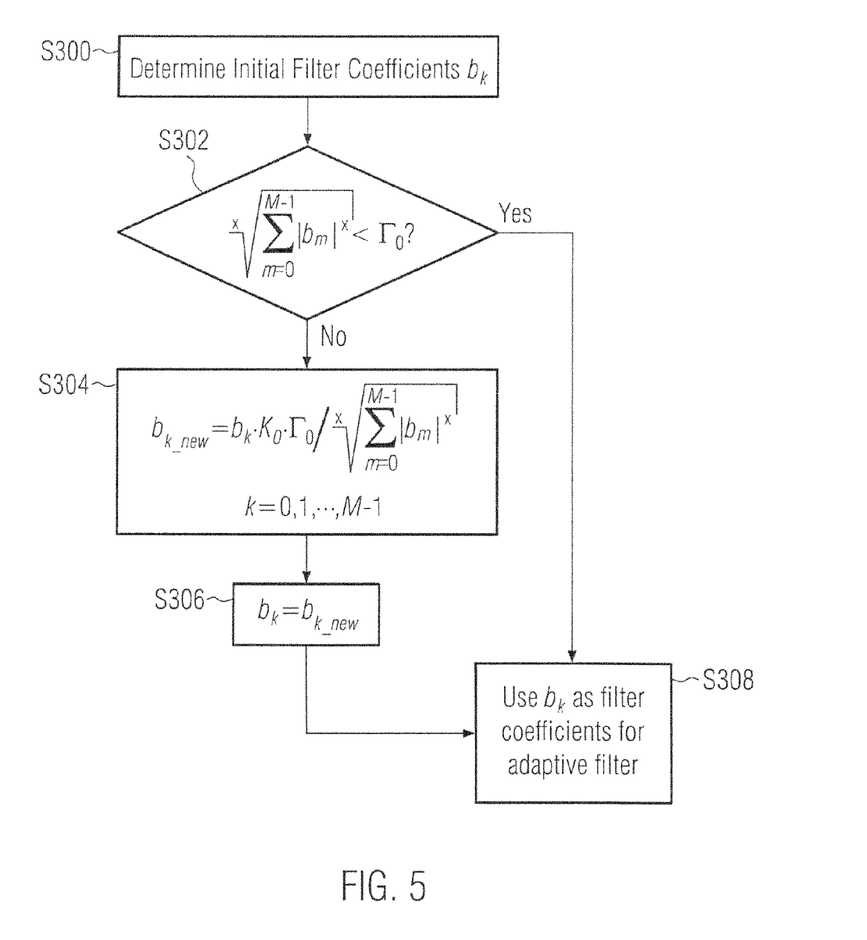
FIG. 5 shows a flowchart illustrating how filter coefficients may be modified during one iteration step.

FIG. 5 shows a flowchart according to which the filter coefficients of e.g. first FIR filter 202 or 402 may be determined. In step S300 initial filter coefficients $b_K$ are determined according to a predetermined iterative adaptation algorithm which may be chosen depending on the application scenario.

In step S302, it is checked if the sum value $$\sqrt[x]{\sum_{m=0}^{M-1} |b_m|^x}$$

is smaller than $\Gamma_0$, wherein x is a real value greater zero, x>0.

If the sum value is smaller then, in step S308, the filter coefficients $b_k$ are used as filter coefficients for the first FIR filter 202.

If, in step S302, the sum is not smaller than $\Gamma_0$, then, in step S304 new filter coefficients are computed according to equation (2) given above.

Then, in step S306 the filter coefficients $b_k$ are replaced by the new filter coefficients $b_{k\_new}$.

Figure 6:
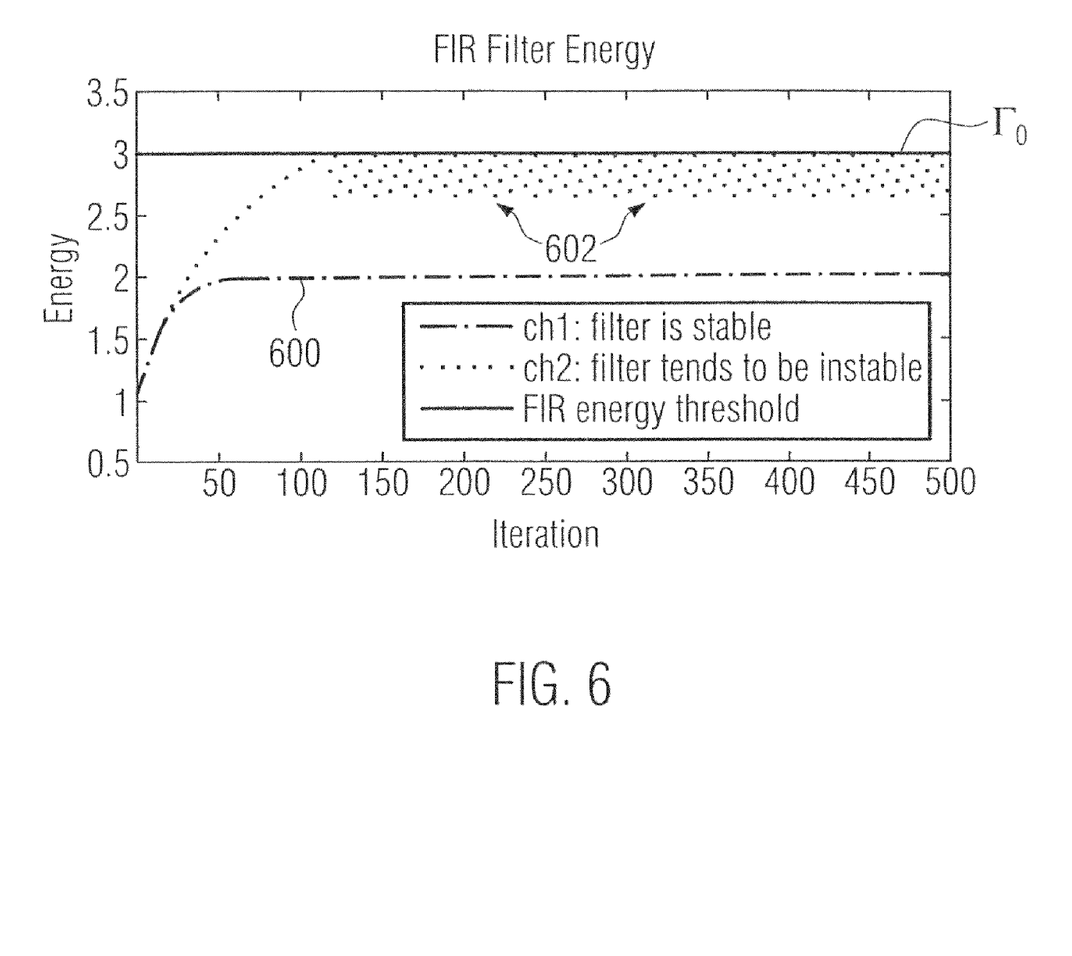
FIG. 6 shows a diagram where the energy of two filters is depicted during the iterative process to determine respective filter coefficients.

FIG. 6 shows the FIR filter energy of the first FIR filter 202 in case of two different multi-path conditions. The first channel ch1 leads to stable filter coefficients (see reference sign 600 in FIG. 6). The sum value, also referred to as FIR filter energy, never exceeds the threshold $\Gamma_0$. As seen, in FIG. 6, the threshold $\Gamma_0$ is set to 3.0. Therefore, a limitation of the FIR filter energy may not be necessary. In contrast, the second channel ch2 leads to a very high FIR filter energy due to a notch in the considered frequency band. Without any counter measure this channel ch2 causes an instable equalization filter. However, if the maximum FIR filter energy is limited as explained above, a long term stable equalization filter may be obtained (see reference sign 602 in FIG. 6).

Figure 7:
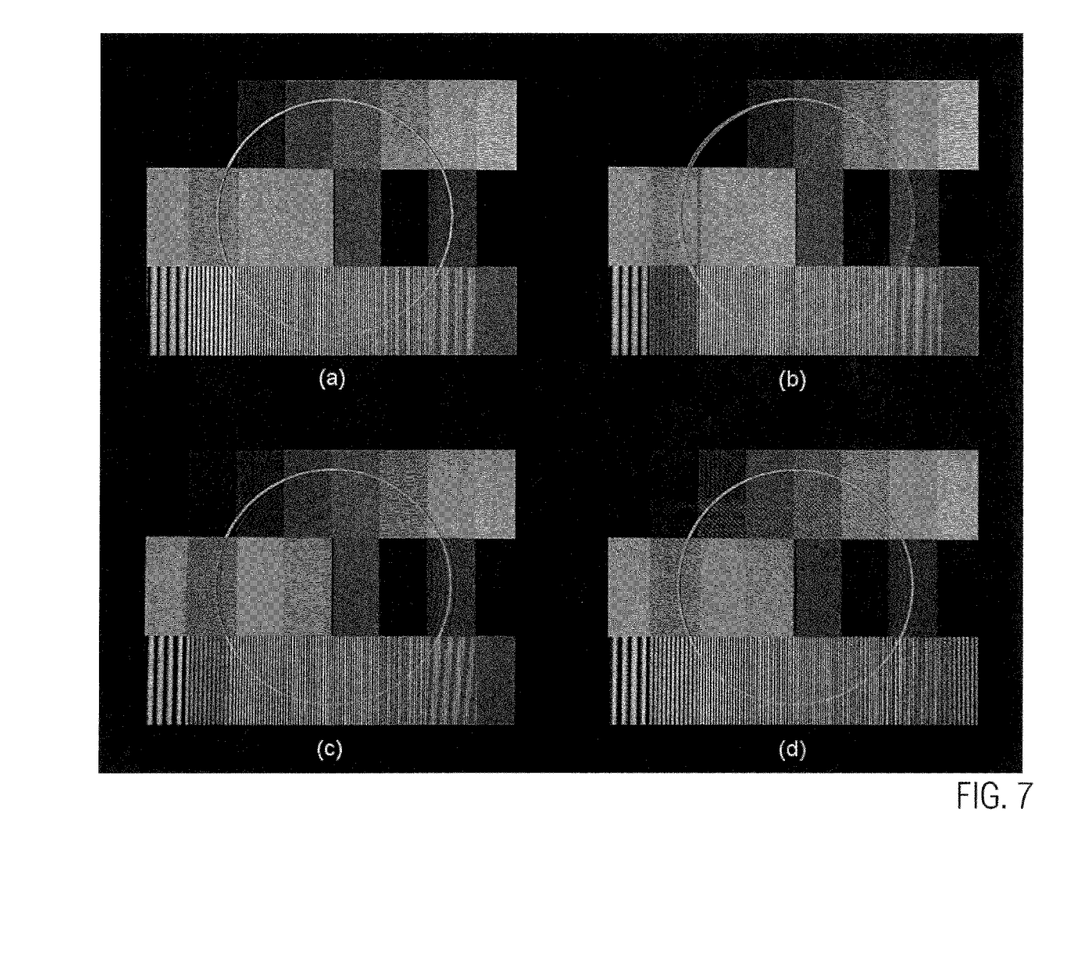
FIG. 7 shows a comparison of a television picture that has been filtered with different filter coefficients.
Figure 8:
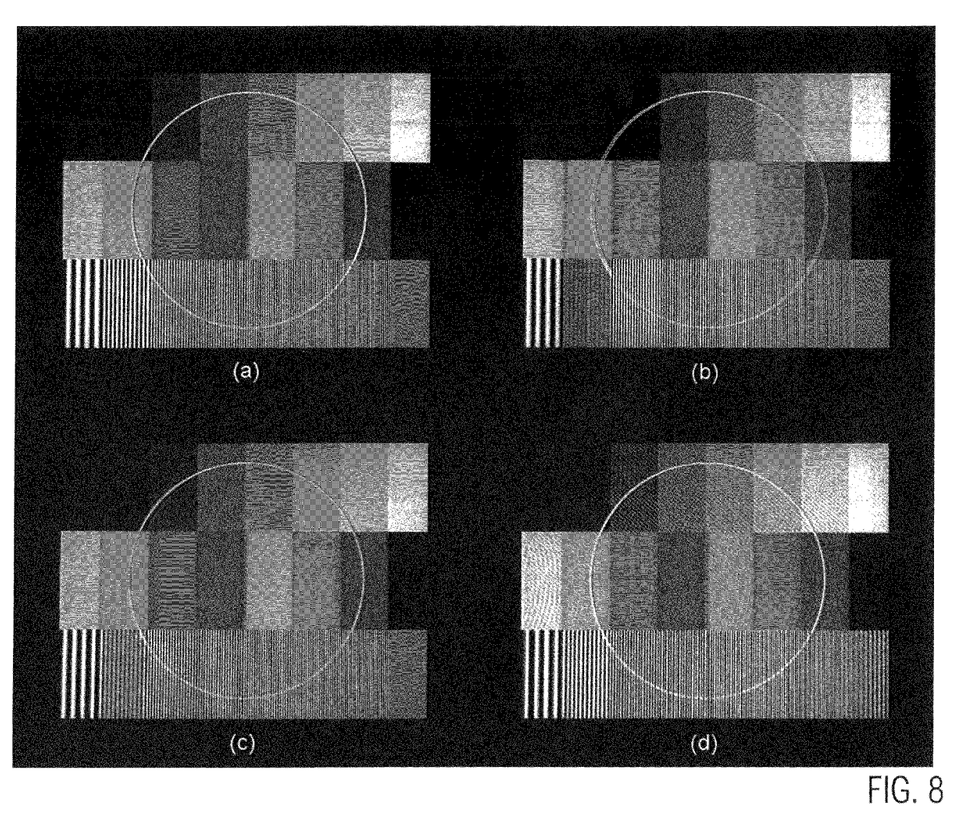
FIG. 8 corresponds to FIG. 7 in color.

The result is shown in FIGS. 7 and 8.

In FIG. 7, picture (a) corresponds to the original television signal. Picture (b) corresponds to the received television signal after multi-path propagation. Picture (c) corresponds to a picture with equalized television signal with FIR filter energy limitation as explained above.

Picture (d) corresponds to a picture obtained by equalizing a television signal without FIR filter energy limitation immediately before the filter gets instable. In other words, picture (d) corresponds more or less to a picture according to prior art. It should be noted that the situation according to the prior art is in reality much worse than shown in picture (d) because after the filter gets instable, the picture is much worse and may not even be visible at all.

FIG. 8 corresponds to FIG. 7 in color.

The invention claimed is:

1. An analog television signal receiver, comprising:
   a receiver configured to receive an analog television signal; and
   an adaptive filter device, including
      a finite impulse response (FIR) filter which is based on filter coefficients $b_k$, the FIR filter configured to determine the filter coefficients, based on a predetermined iterative adaptation algorithm for determining filter coefficients of an adaptive filter, wherein, in at least one iteration step of said predetermined iterative adaptation algorithm performed by the FIR filter, a sum value is determined, wherein at least one summand of said sum value depends on at least one of said filter coefficients, and, if said sum value is above a predetermined threshold, the filter coefficients are modified,
   wherein the adaptive filter device is an equalizer configured to remove at least one multi-path echo of the received analog television signal.

2. The analog television signal receiver according to claim 1, wherein the FIR filter is configured to modify said filter coefficients such that, after modification, said sum value is below said predetermined threshold.

3. The analog television signal receiver according to claim 1, wherein the FIR filter is configured to modify said filter coefficients by multiplying the filter coefficients with a constant value ($K_0$).

4. The analog television signal receiver according to claim 3, wherein said constant value is smaller than or equal to 1.

5. The analog television signal receiver according to claim 1, wherein the FIR filter is configured to modify said filter coefficients by dividing the filter coefficients by said sum value.

6. The analog television signal receiver according to claim 1, wherein the FIR filter is configured to use the modified filter coefficients for a next iteration step of said predetermined iterative adaptation algorithm.

7. The analog television signal receiver according to claim 1, further comprising an infinite impulse response (IIR) filter in cascade with said finite impulse response (FIR) filter.

8. The analog television signal receiver according to claim 7, wherein said FIR filter has a tap size M and said IIR filter has a tap size N, wherein M and N are positive integer values set independently from each other.

9. The analog television signal receiver according to claim 1, wherein the FIR filter is further configured to determine the filter coefficients based on an equation error formulation.

10. The analog television signal receiver according to claim 1, wherein the FIR filter is further configured to determine said filter coefficients to equalize notches.

11. The analog television signal receiver according to claim 1, wherein the FIR filter is configured to calculate said sum value by the following formula:

$$\sqrt[x]{\sum_{m=0}^{M-1} |b_m|^x}$$

wherein $b_m$ denotes a respective filter coefficient, x is a real value greater than zero, and M is a tap size of the FIR filter.

12. The analog television signal receiver according to claim 1, wherein the FIR filter is configured to modify the filter coefficients $b_k$ based on the following formula:

$$b_{k\_new} = b_k \cdot K_0 \cdot \Gamma_0 \bigg/ \sqrt[x]{\sum_{m=0}^{M-1} |b_m|^x}, \ k = 0,1, \ldots, M-1$$

wherein
$b_{k\_new}$: new filter coefficients of adaptive filter for next iteration step;
$b_k$: filter coefficients determined according to predetermined iterative adaptation algorithm;
$K_0$: normalization factor;
$\Gamma_0$: said predetermined threshold,
M: tap size of FIR filter, and
x: real value greater than zero.

13. A method for removing at least one multi-path echo of a received analog television signal using an adaptive filter device in an analog television signal receiver, the method comprising:
determining filter coefficients $b_k$ of a finite impulse response (FIR) filter of the adaptive filter device, by
determining said filter coefficients based on a predetermined iterative adaptation algorithm for determining filter coefficients of an adaptive filter,
determining, in at least one iteration step of said predetermined iterative adaptation algorithm, a sum value, wherein each summand of said sum value depends on one of said filter coefficients, and
modifying, if said sum value is above a predetermined threshold, the filter coefficients; and
filtering the received analog television signal using the adaptive filter to remove the at least one multi-path echo.

14. The method according to claim 13, wherein said filter coefficients are modified such that after modification said sum value is below said predetermined threshold.

15. The method according to claim 13, wherein said filter coefficients are modified by multiplying the filter coefficients with a constant value ($K_0$).

16. The method according to claim 15, wherein said constant value is smaller than or equal to 1.

17. The method according to claim 13, wherein said filter coefficients are modified by dividing the filter coefficients by said sum value.

18. The method according to claim 13, wherein the modified filter coefficients are used for a next iteration step of said predetermined iterative adaptation algorithm.

19. The method according to claim 13, wherein said adaptive filter device further comprises an infinite impulse response (IIR) filter in cascade with said finite impulse response (FIR) filter.

20. The method according to claim 13, wherein said filter coefficients are determined further based on an equation-error formulation.

21. The method according to claim 13, wherein said filter coefficients are determined to further equalize notches.

22. The method according to claim 13, wherein said sum value is calculated by the following formula:

$$\sqrt[x]{\sum_{m=0}^{M-1} |b_m|^x}$$

wherein $b_m$ denotes a respective filter coefficient, x is a real value greater than zero, and M is a tap size of the FIR filter.

23. The method according to claim 13, wherein the filter coefficients $b_k$ are modified based on the following formula:

$$b_{k\_new} = b_k \cdot K_0 \cdot \Gamma_0 \bigg/ \sqrt[x]{\sum_{m=0}^{M-1} |b_m|^x}, \ k = 0,1, \ldots, M-1$$

wherein
$b_{k\_new}$: new filter coefficients of adaptive filter for next iteration step;
$b_k$: filter coefficients determined according to predetermined iterative adaptation algorithm;
$K_0$: normalization factor;
$\Gamma_0$: said predetermined threshold,
M: tap size of FIR filter, and
x: real value greater than zero.

24. A non-transitory computer-readable recording medium that stores therein a computer program, which, when executed by a processor, causes the method according to any of claims 13 to 23 to be performed.

* * * * *